(12) United States Patent
Tailliet

(10) Patent No.: US 6,265,277 B1
(45) Date of Patent: Jul. 24, 2001

(54) METHOD FOR MAKING A BIPOLAR TRANSISTOR FOR THE PROTECTION OF AN INTEGRATED CIRCUIT AGAINST ELECTROSTATIC DISCHARGES

(75) Inventor: François Tailliet, Epinay sur Seine (FR)

(73) Assignee: SGS-Thomson Microelectronics S.A, Gentilly (FR)

( * ) Notice: Subject to any disclaimer, the term of this patent is extended or adjusted under 35 U.S.C. 154(b) by 0 days.

(21) Appl. No.: 09/220,635

(22) Filed: Dec. 24, 1998

Related U.S. Application Data

(62) Division of application No. 08/379,337, filed on Jan. 27, 1995, now Pat. No. 5,886,386.

(30) Foreign Application Priority Data

Jan. 28, 1994 (FR) ................................................. 94 00951

(51) Int. Cl.[7] ............................................. H01L 21/8228
(52) U.S. Cl. ........................... 438/327; 438/335; 438/236
(58) Field of Search .................................. 438/204, 236, 438/325, 335, 339, 200, 234, 327

(56) References Cited

U.S. PATENT DOCUMENTS

| | | | |
|---|---|---|---|
| 4,720,737 | 1/1988 | Shirato | 257/362 |
| 4,990,984 | 2/1991 | Misu | 357/23.13 |
| 5,204,275 | 4/1993 | Lane | 437/31 |
| 5,281,841 | 1/1994 | Van Roozendaal et al. | 257/360 |
| 5,581,104 | 12/1996 | Lowrey et al. | 257/355 |
| 5,591,661 * | 1/1997 | Shiota | 438/200 |

FOREIGN PATENT DOCUMENTS

| | | |
|---|---|---|
| 42 00 884 | 7/1992 | (DE) . |
| 0 266 768 | 5/1988 | (EP) . |
| 0 292 327 | 11/1988 | (EP) . |
| 408 457 | 1/1991 | (EP) . |
| 2 494 501 | 11/1981 | (FR) . |
| 2 090 701 | 7/1982 | (GB) . |
| WO 90 15442 | 12/1990 | (WO) . |

* cited by examiner

*Primary Examiner*—Tuan H. Nguyen
(74) *Attorney, Agent, or Firm*—Wolf, Greenfield & Sacks, P.C.; James H. Morris; Theodore E. Galanthay

(57) ABSTRACT

In a method for the making of a lateral bipolar transistor, the formation of a field oxide layer on the surface of the substrate, between the collector and the emitter of the protection transistor, is avoided. The lateral bipolar transistors made by the disclosed method are advantageously used to protect MOS type integrated circuits against electrical discharges.

14 Claims, 4 Drawing Sheets

METHOD FOR MAKING A BIPOLAR TRANSISTOR FOR THE PROTECTION OF AN INTEGRATED CIRCUIT AGAINST ELECTROSTATIC DISCHARGES

This application is a divisional of Ser. No. 08/379,337 filed Jan. 27, 1995 U.S. Pat. No. 5,886,386.

CROSS-REFERENCE TO RELATED APPLICATION

This application claims priority from French App'n 94-00951, filed Jan. 28, 1994, which is hereby incorporated by reference. However, the content of the present application is not necessarily identical to that of the priority application.

BACKGROUND AND SUMMARY OF THE INVENTION

The invention relates to a method for making a bipolar transistor providing protection against electrostatic discharges in an integrated circuit.

Integrated circuits are generally highly sensitive to electrostatic discharges. Indeed, these discharges result in excess voltages that are short-lived but have high values that may go up to several kilovolts in peak voltage, and induce instantaneous dissipated power values of several tens of Watts. These electrostatic discharges are likely to cause deterioration in the working of the integrated circuits and may even destroy these circuits, for example by excessive heating. It is therefore vitally necessary to take steps against this type of phenomenon by placing protective devices at the input of the integrated circuits.

A first type of protection consists of the connection of limiter diodes between input points of integrated circuits and supply terminals of these integrated circuits. This approach notably has the drawback of being restrictive for the threshold voltages of these diodes limits the range of the values permitted at these input points in normal operation.

Increasingly, therefore, a second protective device using bipolar transistors is being resorted to.

Let it be assumed, for example, that the protective device relates to an integrated circuit that is powered between a positive voltage and a ground and has one input, and that it is sought to protect this integrated circuit against electrostatic discharges of positive voltages.

The integrated circuit is protected by connecting an NPN type bipolar transistor between its input and the ground. The collector is connected to the input of the integrated circuit. The base and the emitter are connected to the ground. The transistor is therefore off in the absence of any electrostatic discharge. For, it is assumed that the voltage values permitted by the manufacturer at input of the circuit are lower than the avalanche voltage value of the protective bipolar transistor. In the event of electrostatic discharge, the protective transistor limits the excess voltage characterizing this discharge. Indeed, the excess voltage prompts an avalanche phenomenon in the protective transistor.

From the technological point of view, the integrated circuits are made notably by metal-oxide-semiconductor (MOS) technology.

With regard to the making of bipolar transistors for the protection of MOS type integrated circuits, it is advantageous to make bipolar transistors without superimposed layers. Indeed, the making of this type of structure requires more steps to be performed than the making of MOS type circuits. It is therefore desirable to integrate the manufacturing of the protective bipolar transistors into the process of manufacturing the MOS type circuits that they protect. This makes it possible to avoid having to add diffusion steps to those already required for the manufacture of a MOS type circuit. Consequently, lateral type bipolar transistors are preferably made for this use.

The method of manufacturing a lateral bipolar transistor of an NPN type in the example chosen typically includes the following basic operations:

the preparation of a P type substrate, the creation, on the surface of the substrate, of a field oxide layer by thermal oxidation, this layer demarcating two source/drain type implantation zones, the implantation of N type dopants in the implantation zones and the diffusion of these dopants in the underlying semiconductor substrate, the vapor phase deposition of an insulator layer on the circuit, the opening of contacts in the implantation zones, the metallization of the contacts.

The implantation zones are zones known as active zones. An active zone is a surface zone of the substrate covered with thin oxide. An active zone such as this is therefore capable of being doped by implantation. Hereinafter, the term "implantation zone" will characterize the active zones that are actually implanted during the manufacturing process. In the example, the implantation or active zones, with their underlying N type diffusion, form the emitter and the collector (hereinafter called electrodes) of the bipolar protective transistor.

The base of the bipolar transistor is constituted by the substrate, the latter being connected to the ground. In practice, the useful base of the transistor is that part of the substrate that is located between the N type diffusions of the emitter and of the collector. The term "useful base" designates the base zone that comes into play in the transistor effect.

The implantation zones are demarcated by the field oxide on the surface of the substrate. Indeed, the field oxide counters the passage of the dopant particles. It therefore insulates the substrate during the doping operations. The implantation zones are characterized by the fact that they are not covered with field oxide.

The making of the implantation and of the diffusion of N type dopants in the implantation zone is integrated into the process for making a MOS type circuit. There is no stacking of three layers with successive N, P and N type doping.

It is possible, before the creation of the field oxide, to carry out a P type implantation and diffusion in the zones that will be covered by the field oxide. Thus, by diffusion, insulator walls known as channel stops are created between the emitter and the collector on the one hand, and between these electrodes and the rest of the circuit on the other hand. Since the substrate is initially a P type substrate, the concentrations of impurities in the insulation wells are naturally greater than that of the substrate.

The insulation wells enable the prevention of a piercing of the transistor, namely a passage of leakage current between the electrodes. Furthermore, these insulator diffusions diminish the formation of parasitic MOS type transistors whose gates would be formed by interconnections passing over the implantation zones.

This method has a drawback. Indeed, it has been observed that, after an electrostatic discharge, leakage currents could appear, in normal operation, between the collector and the base. The term "normal operation" is understood to mean operation that induces no conduction in the protective bipolar transistor.

It has been discovered that these leakage currents are due to the injection of hot carriers into the field oxide between the electrodes, similarly to the phenomenon of ageing of the MOS type transistors. This injection occurs in a region of the field oxide known as the "bird's beak". A bird's beak is a particular feature, shaped like a spike, located at the boundary of a field oxide and a surface of a thermally non-oxidized substrate. It is caused by the lateral oxidation of this substrate.

A hot carrier is the name given to a carrier (in this example an electron) accelerated by the field resulting from an electrostatic discharge and capable of acquiring sufficient energy to overcome the potential barrier of the field oxide. This injection occurs at the bird's beak placed at the boundary of the field oxide between the electrodes, and of the collector of the transistor. This injection remains limited as the carriers are hampered by the field oxide. An electrical field is created at the surface of the field oxide, on the collector side, and induces a leakage current between the collector and the substrate of the transistor.

In view of the above, the aim of the present invention is to propose a method for the making of a protective lateral bipolar transistor that can be used to eliminate the leakage currents that appear in normal operation, after a discharge.

The approach proposed by the invention is that of eliminating the field oxide zone which the injection of hot carriers occurs into, inducing leaks. This field oxide zone is the one between the two implantation zones corresponding to the electrodes of the bipolar transistor. It therefore covers the useful base of the bipolar transistor.

According to the invention, this aim is achieved by implementing a method for the manufacture of a protective bipolar transistor for protection against electrostatic discharges in an integrated circuit, comprising, in the following order, masking operations enabling the demarcation, for this bipolar transistor, on the surface of a semiconductor substrate, of two implantation zones and a separation zone between said implantation zones, and an operation for the implantation of the implantation zones with impurities enabling the selective doping of these implantation zones, wherein the masking operations comprise a first step with a total or overall contour masking operation to make a field oxide around an active zone encompassing the implantation zones and a second step with a masking enabling the separation, within this active zone, of the differentiated implantation zones, and wherein, subsequently to the operation for the implantation of the implantation zones, an operation is carried out to cover a part of the implantation zones and of the separation zone with a deposited insulator, this insulator being deposited against the surface of the semiconductor substrate at the position of the separation zone.

This thus prevents the injection of hot carriers into the bird's beak of the field oxide, at the separation zone of the implantation zones, on the collector side. The bird's beak has disappeared at this position.

The elimination of the field oxide between the implantation zones calls for steps to be taken with respect to the masks used during the operations for the thermal oxidation and doping of the implantation zones. Indeed, the demarcation of the implantation zones was previously obtained by the field oxide. The field oxide covered the separation zone between the implantation zones.

The method according to the invention makes it possible to dope the implantation regions selectively, by masking the separation zone temporarily during the doping of the implantation zones.

Thus, during the masking operations, there is made a field oxide that does not cover the implantation zones and the separation zone between the implantation zones. The separation zone between the implantation zones is masked temporarily during the operation for the implantation of the implantation zones, only the implantation zones being doped during this operation.

Hence there is no more than just one active zone (namely a zone covered with thin oxide) instead of two as was the case previously. This active zone includes the two implantation zones and the separation zone between said zones.

Usually, the implantation masks are generated automatically by a computer program, on the basis of the mask demarcating the active zones and information elements defining the type of doping (N or P) of these zones. It is therefore not usual to take action at these levels. Indeed, in MOS technology, the diffusions of a same type are either separated by a gate to form a MOS transistor or separated by field oxide.

The invention can be used to make a bipolar transistor providing protection against electrostatic discharges in an integrated circuit, comprising:

a semiconductor substrate implanted with a first type of dopant in a certain concentration, a field oxide layer covering a part of the semiconductor substrate, the uncovered part forming an active zone, two distinct implantation zones implanted with a second type of dopant in the active zone, a separation zone, in the active zone, between these implantation zones, said device comprising a layer of an insulator deposited on the surface of the transistor after the implantation of the implantation zones, this layer of insulator being in contact with a part of the implantation zones and the separation zone, and wherein the deposited insulator is in contact with the semiconductor substrate at the position of the separation zone.

In standard MOS technology, the insulator deposited is in contact with MOS type transistor gates, field oxide zones and implantation zones.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation), in which:

In the making of an NPN type lateral bipolar transistor according to the prior art, typically the following steps are performed:

creation, on the surface of a P type semiconductor substrate, of a field oxide layer by thermal oxidation, this layer demarcating two implantation zones, implantation of N type dopants on the implantation zones and the diffusion of these dopants in the underlying semiconductors substrate, vapor phase deposition of an insulator layer deposited on the circuit, opening of contacts in the implantation zones, and metallization of the contacts.

Naturally, the method used to make a transistor calls for a far greater number of steps. All that shall be described here are the steps needed for an understanding of the invention.

FIGS. 1a, 1b, 1c, 2a, 2b and 2c represent masks seen from above. In these figures:

a mask is represented by a geometrically square shape;

the hatched zones of the masks represent protected zones that undergo no structural modification during the step in question. In practice, they are zones covered with a layer of non-insolated photosensitive resin (in the case of a positive photoresin) or insolated photosensitive resin (in the case of a negative photoresin); and the non-hatched zones are the zones of the substrate that undergo a structural modification during the step in question.

In practice, they are zones covered with a layer of insolated photosensitive resin (in the case of a positive photoresin) or non-insolated photosensitive resin (in the case of a negative photoresin).

Of course, these masks form part of bigger masks not shown herein, used to make an entire integrated circuit protected by a lateral bipolar transistor against electrostatic discharges. The making of the protective transistors logically forms part of the making of the integrated circuit that they protect.

Figure 1A:
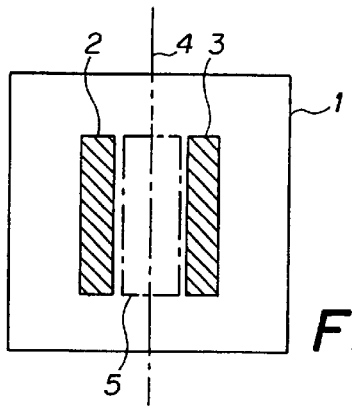
FIGS. 1*a*, 1*b* and 1*c* represent a part of the masks used in a method for making a lateral bipolar transistor according to the prior art.

FIG. 1a shows a mask 1 used for thermal oxidation of the semiconductor substrate of a protective, transistor made according to the prior art. In this mask, two hatched rectangular zones 2 and 3 having the same dimensions are placed symmetrically with respect to a fictitious axis of symmetry 4, shown by means of dashes, connecting the midpoints of two opposite sides of the mask 1. The other zones of the mask are not hatched.

This first mask 1 can be used to make a field oxide on the entire substrate of the transistor, except on the hatched zones 2 and 3 which will form the zones of implantation of the transistor (emitter and collector). Two active zones are therefore made on the surface of the semiconductor substrate, corresponding to the implantation zones 2 and 3.

The implantation zones 2 and 3 are not in contact. This would correspond to short-circuiting the emitter and the collector of the transistor that is made. They therefore do not intersect the fictitious axis of symmetry 4. Consequently, between the implantation zones 2 and 3, there is a non-hatched zone 5 called a separation zone. This zone 5 is rectangular, and two of its sides, which are opposite sides, are formed by the symmetrical sides of the implantation zones 2 and 3 closest to the fictitious axis of symmetry 4. The contour of this separation zone 5 is represented by alternating dots and dashes. In practice, this separation zone 5 covers the useful base of the bipolar protective transistor.

In the diagrams, for reasons of readability, the actual proportions of a transistor have not been followed.

In practice, the semiconductor substrate of the protective bipolar transistor occupies a rectangular area of the order of 200 micrometers by 150 micrometers. The implantation zones are of the order of 100 micrometers by 25 micrometers. The fictitious axis of symmetry is parallel to their biggest sides and they are off-centered with respect to the axis by about 1 micrometer. Thus, the separation zone is about 100 micrometers by 2 micrometers.

The semiconductor substrate of the protective transistor is a P type substrate in the example dealt with.

Figure 1B:
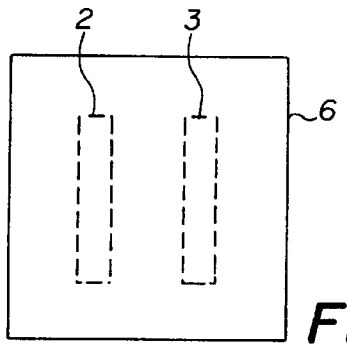

FIG. 1b shows a first doping mask 6 which is not hatched in the figure. This doping mask 6 is used to dope the implantation zones 2 and 3, whose contours are shown in dashes. In the example considered, it is the mask used for the N type doping of the emitter and collector of the protective transistor. It is assumed that these implantation zones are doped with the same dopant, an assumption that corresponds to reality. Only the implantation zones 2 and 3 will be doped, the others being insulated by the field oxide previously formed by means of the mask 1 of FIG. 1a.

Figure 1C:
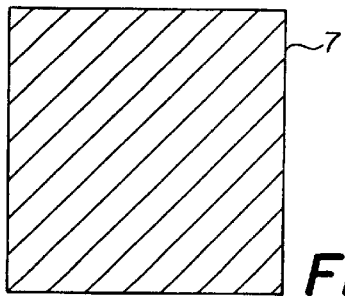

FIG. 1c shows a second doping mask 7 which is hatched in the figure. It is a doping mask used to dope implantation zones with a P type dopant. In the example being dealt with, no implantation zone of the protective transistor is doped with this type of dopant, with the exception of course of the semiconductor substrate. However, this mask has been shown since it may be necessary to carry out the doping, at another position of the integrated circuit, of the implantation zones with a P type dopant.

In the method according to the invention, the masks of FIGS. 1a and 1b are modified.

Hereinafter in the invention, it is assumed for simplicity's sake that the surface of the protective transistor as well as the location and the surface of the implantation zones are identical, whether the manufacture is done according to the prior art or according to the invention.

Figure 2A:
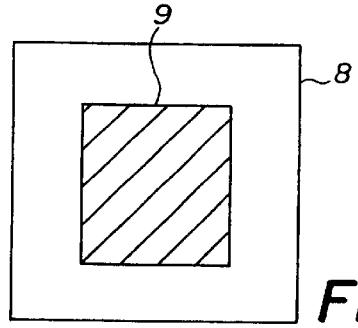
FIGS. 2*a*, 2*b* and 2*c* represent the masks equivalent to those referred to above, used in a method according to the invention.

FIG. 2a shows a mask 8 called an overall contour mask. This overall contour mask 8 is a mask used to form a field oxide on the surface of the semiconductor substrate of a protective transistor made according to the invention. It corresponds, in the invention, to the prior art mask 1. The overall contour mask 8 has a single hatched zone 9. This active zone 9 is rectangular and correspond to the joining of the implantation zones 2 and 3 and of the separation zone 5 as defined in FIG. 1a.

Thus, a field oxide is made around the implantation zones. The term "around the implantation zones" is understood to mean around the active zone 9 defined here above.

Figure 2B:
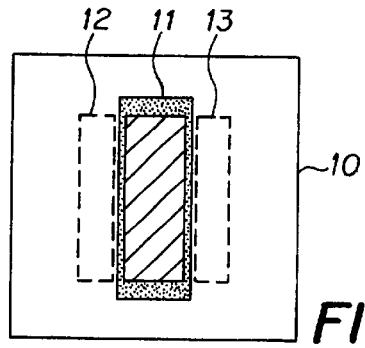

FIG. 2b shows a first doping mask 10 corresponding to the mask 6 of FIG. 1b. It is used for an N type doping. It includes a hatched zone 11 called a separation zone between two implantation zones 12 and 13. The implantation zones 12 and 13 correspond to the implantation zones 2 and 3 of FIG.

1a. The contours of these implantation zones 12 and 13 are shown in dashes. They are rectangular, placed similarly to the zones 2 and 3, and take up surface areas equivalent to those of the zones 2 and 3. The separation zone 11, which is rectangular, corresponds to the separation zone 5 of FIG. 1a. In practice, as shown in FIG. 2b, the separation zone 11 takes up a greater area than the separation zone 5 of FIG. 1a. Using the term "height" to designate the dimension of the rectangular surfaces that is parallel to the fictitious axis of symmetry 4 (see FIG. 1a), the height of the separation zone 11 is greater than that of the separation zone 5 of FIG. 1a. This extra size makes it possible to ensure total protection of the edges of the separation zone 11, in the event of misalignment of the doping mask 10 with respect to the overall contour mask 8. Without this precaution, there would be a risk of there being only one implantation zone formed by the meeting of the implantation zones 12 and 13 and a part of the separation zone 11. The surface area of the joining of the zones 11, 12 and 13 corresponds to the surface area of the active zone 9 of the overall contour mask 8, plus the surface area of the extra sizes of the separation zone 11.

Figure 2C:
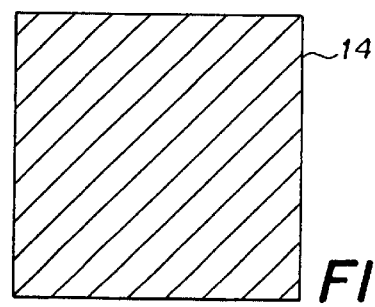

FIG. 2c shows a second doping mask 14, corresponding to the mask 7 of FIG. 1c. This doping mask 14 is used for a P type doping. It is identical to the doping mask 7 of FIG. 1c.

In the invention, the doping is done as if the separation zone 11 between the implantation zones 12 and 13 were going to be doped with a P type dopant. This separation zone 11 is therefore temporarily protected during the N type doping of the implantation zones 12 and 13, for example by means of a resin. This protection is continued during the P type doping, which means that this separation zone 11 is finally not doped except of course at the start of the procedure, when the substrate of the protective transistor is made.

Figure 3:
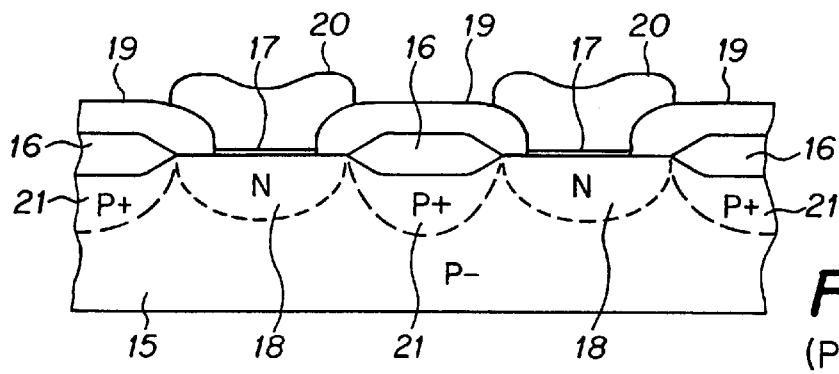
FIG. 3 shows a sectional view of a lateral bipolar transistor made according to the prior art.

FIG. 3, which is a sectional view of a protective bipolar transistor made according to the prior art, shows:
- a semiconductor substrate 15 with P-type doping which is a P type doping with a typical dopant concentration of $10^{16}$ impurities/cm$^3$.
- on the surface of this semiconductor substrate 15, the mask 1 of FIG. 1a has been used to form a field oxide layer 16 interrupted at two zones 17 of the surface. These implantation zones 17, which are not covered with field oxide 16, correspond to the emitter and to the collector of the protective transistor. These implantation zones 17 are doped by the diffusion of an N type dopant with a concentration of $10^{19}$ to $10^{20}$ impurities/cm$^3$. The doping is done selectively by means of the mask 10 of FIG. 2b. In a standard way, after the surface implantation of dopants on the implantation zones 17, there is a diffusion of these dopants in the underlying semiconductor substrate 15. Thus, N type diffusions 18 are created beneath the implantation zones 17. The contours of these diffusions 18 in the semiconductor substrate 15 are shown by small dashes. In practice, the diffusion is done on a thickness of 0.2 to 0.3 micrometers.

Then, an insulator layer 19 is shown, formed by deposition on all the circuits. This layer makes it possible, in practice, to insulate the zones of implantation from interconnections, if any, passing over. This insulator layer 19 is interrupted at one part of the surfaces of the implantation zone in order to create a contact zone between the implantation zones 17 and metallizations 20. It therefore covers only the field oxide 16 and a part of the implantation zones 17. In practice, this layer has a thickness of the order of one micrometer.

Finally, the figure shows zones of P type diffusions 21, referenced P+, with a concentration in the range of $10^{17}$ impurities/cm$^3$. These diffusion zones 21, called channel stops, are used to prevent the piercing of the transistor and the appearance of unwanted MOS parasitic transistors. They are placed in the semiconductor substrate 15, beneath the field oxide 16. Their contours are shown by means of dashes. These channel stops 21 are about one micrometer deep. They are obtained by the diffusion of dopants after the implantation of these dopants on the surface of the semiconductor substrate 15. The creation of these channel stops 21 is naturally prior to the formation of field oxide on the surface of the semiconductor substrate 15.

Figure 4:
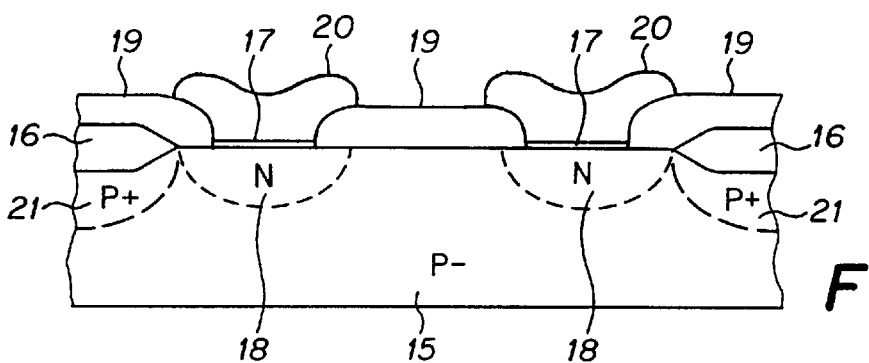
FIG. 4 shows a sectional view of a lateral bipolar transistor made according to the method of the invention.

FIG. 4 is equivalent to FIG. 3, if only because there is no field oxide 16 between the implantation zones 17. Between the implantation zones 17, there is created a separation zone corresponding to the separation zone 11 of FIG. 2b. This separation zone is therefore not doped with an N type dopant, but is nevertheless not covered with a field oxide layer 16. The insulator layer 19 between the implantation zones 17 is therefore directly in contact with the semiconductor substrate 15.

Furthermore, there is no channel stop 21 between the implantation zones 17. The base of the protective lateral bipolar transistor is therefore less doped. This tends to improve the current gain of this transistor. Consequently, there is a reduction in the energy dissipated in this transistor by Joule effect during an electrostatic discharge. This makes it possible to extend the lifetime of this transistor. It is possible, if necessary, to implant a channel stop 21 between the implantation zones 17. This would make it necessary to carry out the diffusion of dopants to create this channel stop 21 before creating the field oxide layer 16. Now, in practice, the channel stops 21 are made by heating, at the same time as the field oxide layer 16 is created.

Figure 5:
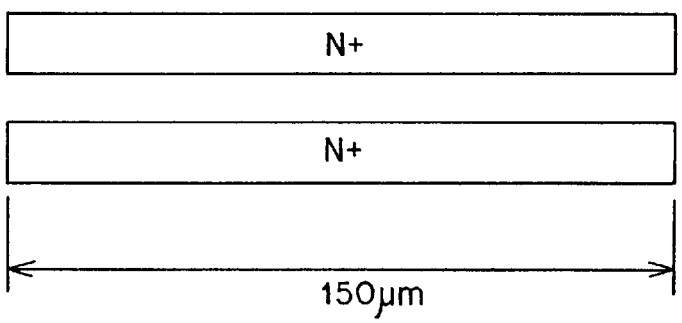
FIG. 5 shows an example of the lateral dimensions used, in a sample embodiment. In this example the substrate doping is typically about 1 to 5 $\Omega$-cm.

FIG. 5 shows an example of the lateral dimensions used, in a sample embodiment. In this example the substrate doping is typically about 1 to 5 Ω-cm.

According to a disclosed class of innovative embodiments, there is provided: An integrated circuit structure comprising a substrate including a plurality of surface semiconductor portions of monolithic semiconductor material, said surface semiconductor portions being laterally separated by surface insulator portions which rely varied portions of said semiconductor material; one or more transistors, each formed in a respective one of said surface semiconductor portions; and an ESD protection structure in at least one of said surface semiconductor portions, comprising two laterally spaced diffusions of a first conductivity type which are both located in a common one of said surface semiconductor portions which has a second conductivity type; one of said diffusions being connected to ground, and another of said diffusions being connected to a contact pad which is not a ground pad.

According to another disclosed class of innovative embodiments, there is provided: A CMOS integrated circuit, comprising: a substrate including a plurality of surface semiconductor portions of monolithic semiconductor material, said surface semiconductor portions being laterally separated by surface insulator portions which rely varied portions of said semiconductor material; a first plurality of field-effect transistors, each having source/drain regions of a first conductivity type formed in a respective one of said surface semiconductor portions which has a second conductivity type; and a second plurality of field-effect transistors, each having source/drain regions of a first conductivity type formed in a respective one of said surface semiconductor portions which has a second conductivity type; and an ESD protection structure in at least one of said surface semiconductor portions, comprising two laterally spaced diffusions of a first conductivity type which are both located in a common one of said surface semiconductor portions which has a second conductivity type, said laterally spaced diffusions having the same doping profile as said source/drain diffusions of at least some ones of said field-effect transistors; one of said diffusions being connected to ground, and another of said diffusions being connected to a contact pad which is not a ground pad.

According to another disclosed class of innovative embodiments, there is provided: A method for protecting a CMOS integrated circuit against electrostatic discharges, comprising the steps of: providing an ESD protection structure consisting of two laterally spaced source/drain diffusions in a single active area which has a second conductivity type, one of said diffusions being connected to ground, and another of said diffusions being connected to a contact pad which is not a ground pad; and connecting said contact pad to drive the gate of at least one field-effect transistor of said integrated circuit; whereby said ESD protection structure provides conduction to ground when excess voltage occurs on said contact pad.

According, to another disclosed class of innovative embodiments, there is provided: A method for the making of a protective bipolar transistor for protection against electrostatic discharges in an integrated circuit, comprising, in the following order: masking operations enabling the demarcation, for this bipolar transistor, on the surface of a semiconductor substrate, of two implantation zones and a separation zone between said implantation zones; an operation for the implantation of the implantation zones with impurities enabling the selective doping of these implantation zones, wherein the masking operations comprise: a first step with an overall contour masking operation to make a field oxide around an active zone encompassing the implantation zones and a second step with a masking enabling the separation, within this active zone, of the differentiated implantation zones, and wherein, subsequently to the operation for the implantation of the implantation zones, an operation is carried out to cover a part of the implantation zones and of the separation zone with a deposited insulator, this insulator being deposited against the surface of the semiconductor substrate at the position of the separation zone.

According to another disclosed class of innovative embodiments, there is provided: A method for the making of a protective bipolar transistor for protection against electrostatic discharges in an integrated circuit, comprising, in the following order: masking operations enabling the demarcation, for this bipolar transistor, on the surface of a semiconductor substrate, of two implantation zones and a separation zone between said implantation zones; an operation for the implantation of the implantation zones with impurities enabling the selective doping of these implantation zones, wherein, during the masking operations, a field oxide is made that does not cover the implantation zones and the separation zone between the implantation zones, and wherein, the separation zone between the implantation zones is masked temporarily during the implantation operation, only the implantation zones being doped during this implantation operation.

According to another disclosed class of innovative embodiments, there is provided: A bipolar transistor providing protection against electrostatic discharges in an integrated circuit, comprising: a semiconductor substrate implanted with a first type of dopant in a certain concentration, a field oxide layer covering a part of the semiconductor substrate, the uncovered part forming an active zone, two distinct implantation zones implanted with a second type of dopant in the active zone, a separation zone, in the active zone, between these implantation zones, said device comprising: a layer of an insulator deposited on the surface of the transistor after the implantation of the implantation zones, this layer of insulator being in contact with a part of the implantation zones and the separation zone, and wherein, the deposited insulator is in contact with the semiconductor substrate at the position of the separation zone.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

The preferred variant of a method for making a protective lateral bipolar transistor according to the invention, as described above, is illustrative and not restrictive. In particular, the implantation zones are not necessarily rectangular and/or symmetrical. Thus, the implantation zones can be made in the form of combs for example. Furthermore, the described method can also used to make PNP type lateral bipolar transistors.

Figure 7A:
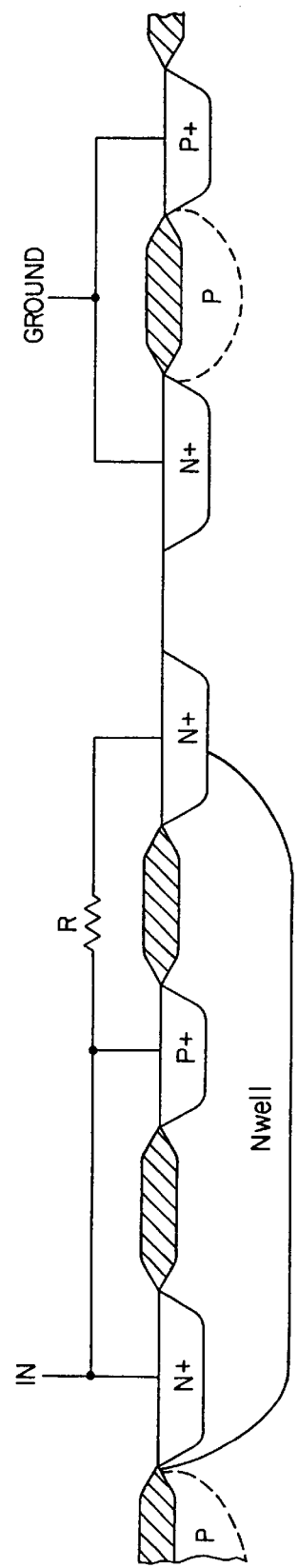
FIGS. 7A and 7B exemplify other ESD structures in which the lateral field isolation oxide can be omitted according to the present invention.
Figure 7B:
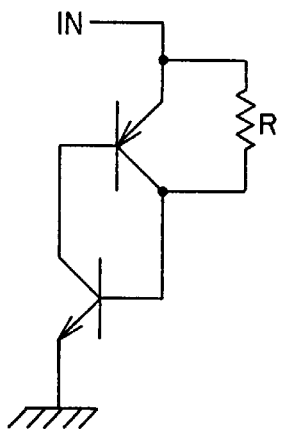

FIGS. 7A and 7B exemplify other ESD structures in which the lateral field isolation oxide can be omitted according to the present invention.

Figure 8:
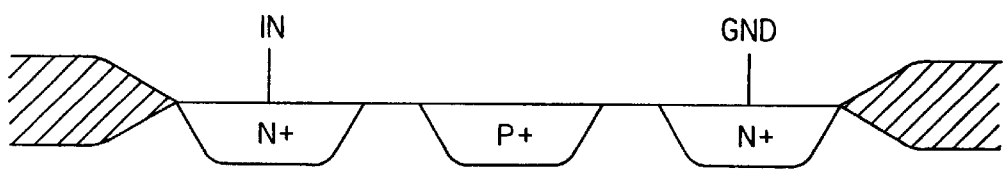
FIG. 8 shows another alternative embodiment, wherein the surface of the lateral device's base is implanted with the P+ source/drain implant.

FIG. 8 shows another alternative embodiment, wherein the surface of the lateral device s base is implanted with the P+ source/drain implant. This can be done in a CMOS process with no extra masking steps. In such a case, a gap must be left between the N+ and P+ diffusions: if the P+ and N+ zones come in contact, the resulting P+/N+ diode has a breakdown voltage of e.g. 3 V, which is too low. However, this embodiment is less preferred.

Figure 9:
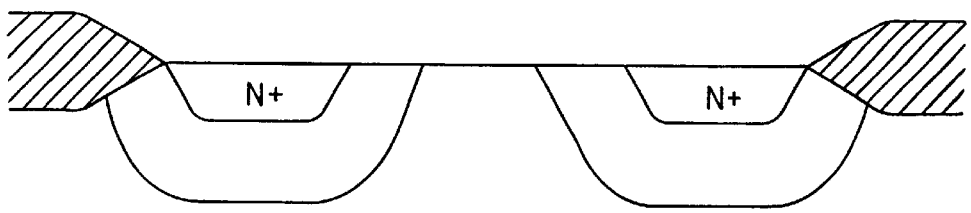
FIG. 9 shows an alternative embodiment wherein N-well diffusions are used in addition to the N-type source/drain diffusions.

In the presently preferred embodiment, the N-type diffusions shown are source/drain diffusions. However, in a further class of alternative embodiments, as shown in FIG. 9, N-well diffusions can be used as well.

Figure 6:
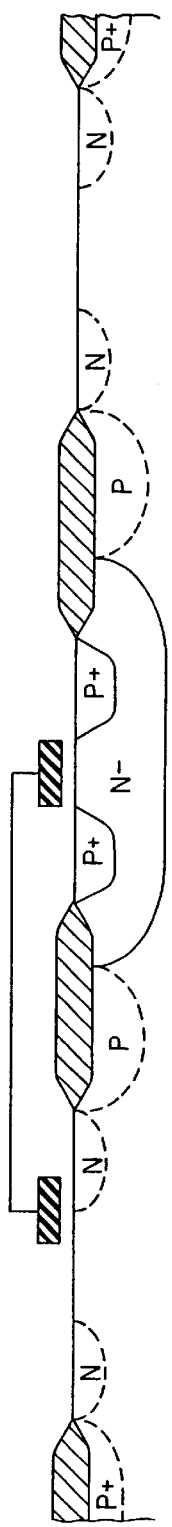
FIG. 6 is a schematic sectional drawing which shows an ESD device according to the present invention side-by-side with CMOS devices made in the same process.

FIG. 6 is a schematic sectional drawing which shows an ESD device according to the present invention side-by-side with CMOS devices made in the same process.

In a further class of alternative embodiments, the innovative protection structure can be implemented as a NPN device instead of an PNP device. NPN has the advantage of the "snapback" characteristic which is absent in PNP. (See U.S. Pat. No. 5,016,078, which is hereby incorporated by reference).

For another example, the disclosed inventions can also be applied to NMOS processes as well as CMOS processes.

What is claimed is:

1. A method of making a protective bipolar transistor for protection against electrostatic discharges in an integrated circuit, comprising steps of, in the following order:
   a) masking a portion of a surface of a semiconductor substrate for the bipolar transistor, the masking comprising steps of:
      first, performing an overall contour masking operation for forming a field oxide around an active zone encompassing the implantation zones and
      second, performing a masking operation, within this active zone, to form a separation zone between two implantation zones, b) implanting the implantation zones with impurities to selectively dope the implantation zones, and c) covering a part of the implantation zones and of the separation zone with a deposited insulator, this insulator being deposited against the surface of the semiconductor substrate in the separation zone.

2. A method according to claim 1, wherein the step of covering a part of the implantation zones and of the separation zone with a deposited insulator includes depositing the insulator against the surface of the semiconductor substrate in an entire surface of the separation zone.

3. A method for producing an integrated circuit having a bipolar transistor for protection against electrostatic discharges comprising steps of:

performing masking operations to demarcate an active area, for said bipolar transistor, on a surface of a semiconductor substrate implanted with a first type of dopant;

making a field oxide layer that does not cover said active area;

masking a separation zone in said active area with a doping mask to form at least two implantation zones separated by said separation zone, said separation zone acting as a base of a bipolar transistor;

introducing a dopant of a second type into said implantation zones;

removing said doping mask from said separation zone;

depositing an insulating layer over said separation zone, this insulator being deposited against the surface of the semiconductor substrate in the separation zone and extending partially over said implantation zones.

4. A method according to claim 3, wherein said substrate is a monolithic substrate.

5. A method according to claim 3, further comprising the steps of forming respective connections to said implantation zones, and connecting one of said connections to a constant voltage source.

6. A method according to claim 3, wherein said separation zone has a concentration of dopants approximately equal to the concentration of dopants in said substrate.

7. A method according to claim 3, further comprising the steps of before making said field oxide layer, creating channel stops in the surface of said substrate by implanting dopants of said first type in said surface of said substrate in a higher concentration than at the level of said separation zone.

8. A method according to claim 3, wherein concentration of said dopants of said first type in said channel stops is approximately $10^{17}$ impurities/cm$^3$.

9. A method according to claim 3, wherein said substrate is Si.

10. A method according to claim 3, wherein said masking operations comprise the steps of performing an overall contour masking operation for forming a field oxide around an active zone encompassing the implantation zones and performing a masking that separates within this active zone, the implantation zones.

11. A method according to claim 3, wherein said doping mask covers a larger area than said separation zone.

12. A method according to claim 3, wherein the first type of dopant is a P type dopant, and the second type of dopant is the N type dopant.

13. A method according to claim 3, wherein said insulating layer extends at least to said field oxide in the portion of the active area that is not an implantation zone.

14. A method according to claim 3, wherein the step of depositing an insulating layer includes depositing the insulator against the surface of the semiconductor substrate in an entire surface of the separation zone and extending partially over said implantation zones.

* * * * *